United States Patent [19]

Wile

[11] Patent Number: 4,979,189
[45] Date of Patent: Dec. 18, 1990

[54] SELF-TIMING QUALIFICATION CHANNEL
[75] Inventor: Donald T. Wile, San Jose, Calif.
[73] Assignee: National Semiconductor Corporation, Santa Clara, Calif.
[21] Appl. No.: 395,967
[22] Filed: Aug. 18, 1989
[51] Int. Cl.[5] .......................................... H03K 5/153
[52] U.S. Cl. ...................................... 375/95; 375/102; 375/103; 375/110; 360/51; 307/350; 307/351
[58] Field of Search .................... 328/108; 360/42, 51; 307/350, 351; 375/94, 95, 102, 103, 110

[56] References Cited

U.S. PATENT DOCUMENTS

| | | | |
|---|---|---|---|
| 3,588,714 | 6/1971 | McIntosh | 375/103 |
| 4,216,543 | 8/1980 | Cagle et al. | 375/95 |
| 4,507,795 | 3/1985 | Wagner | 375/95 |
| 4,675,880 | 1/1987 | Davarian | 375/102 |
| 4,780,888 | 10/1988 | Solhjell et al. | 375/110 |
| 4,876,697 | 10/1989 | Whitfield | 375/110 |
| 4,878,029 | 10/1989 | Saulnier et al. | 375/102 |

OTHER PUBLICATIONS

National Semiconductor Advanced Peripherals Mass Storage Handbook (1988) DP8461/65 Data Separator, DP8451/55 Data Synchronizer.
National Semiconductor Advanced Peripherals Mass Storage Handbook (1988) DP8469 Synchronizer/2,7 Endec.
National Semiconductor Advanced Peripherals Mass Storage Handbook (1988) Disk Interface Design Guide and Users Manual.

Primary Examiner—Benedict V. Safourek
Assistant Examiner—Young T. Tse
Attorney, Agent, or Firm—Steven F. Caserza; Lee Patch

[57] ABSTRACT

A novel self-timing qualification channel structure is taught, suitable for use in detecting data from a magnetic disk or other storage medium. A timing comparator is used in addition to a hysteresis comparator in order to detect when the true peak of the input signal is about to occur. The timing comparator output determines when signal qualification by the hysteresis comparator is to occur. The timing comparator only allows signal qualification to occur just prior to the true peak in the input signal. Because of this, the risk of falsely detecting off track noise or noise in the shoulder region is greatly reduced. In one embodiment, the timing comparator operates without the need for additional external components by utilizing the existing channel filter. Thus, the channel filter serves two purposes: to filter the channel input signal prior to detection and to provide delay for the timing comparator. The detector of this invention is ideally suited for detecting data from a constant density recording environment where a multiple data rates are encountered. The improved immunity to off track noise allows track density to be increased, thereby increasing the storage capacity of the disk.

24 Claims, 10 Drawing Sheets

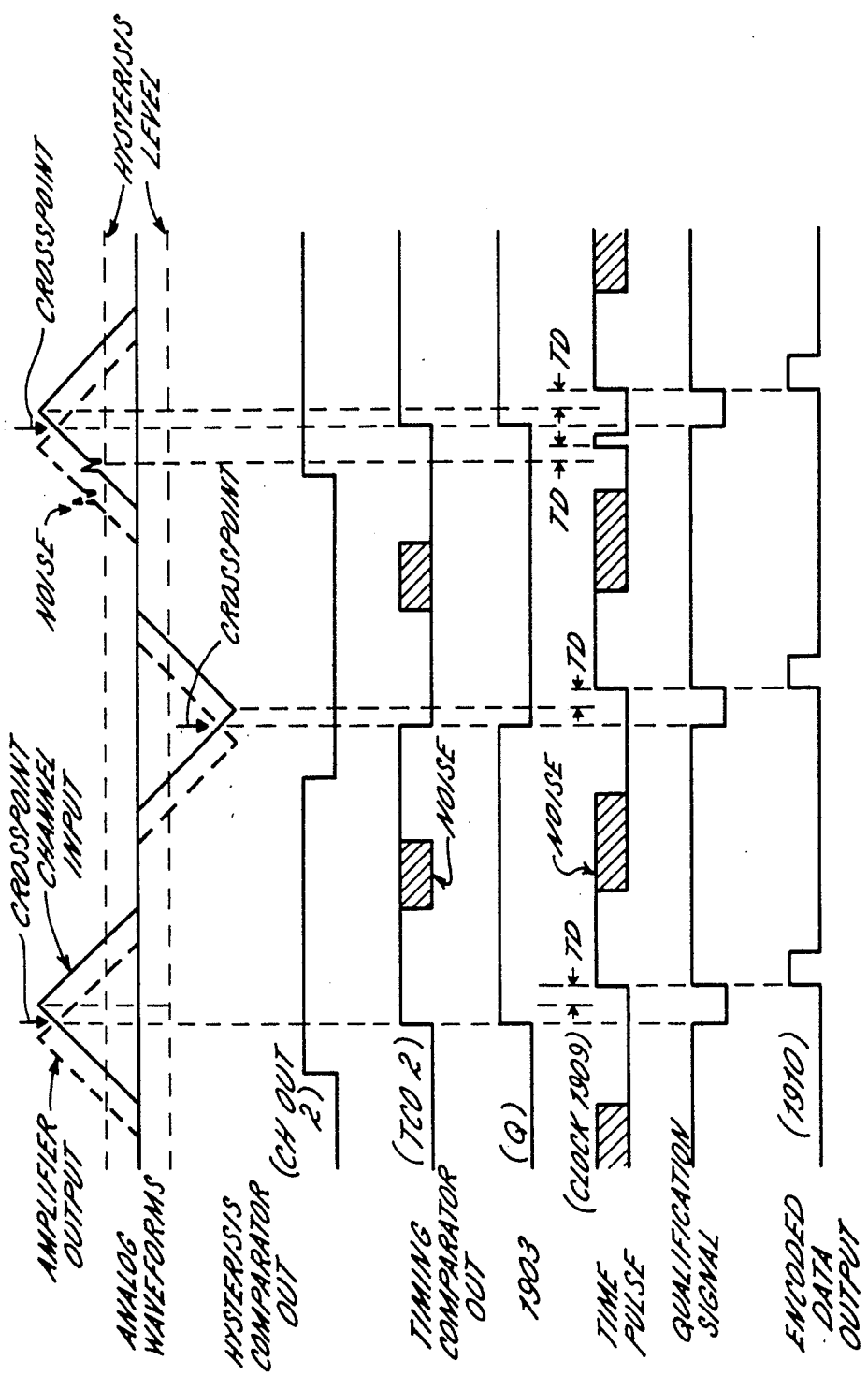

SELF-TIMING QUALIFICATION CHANNEL

BACKGROUND

FIG. 1 shows a block diagram of a prior art pulse detector 100 such as the National Semiconductor DP8464B device, suitable for use in detecting data from a magnetic disk storage device. The purpose of the pulse detector is to accurately convert peaks in the analog signal from the disk to digital edges of identical time position. This task is accomplished by first determining that a given disk signal is valid (i.e. not noise) and then determining the exact time position of the signal peak. The determination of the signal validity is accomplished in what is often called "gating" or "qualification" channel 199. The extraction of the timing of the peaks is accomplished in what is often called "timing channel" 198. In the case of the DP8464B, qualification channel 199 consists of comparator with hysteresis 102, while timing channel 198 consists of differentiator 111. The timing and gating channels are combined by flip-flop 101 to produce an output data stream.

Pulse detector 100 of FIG. 1 includes differential input leads 105 which serve to receive a differential input signal from a disk or, more typically, a read/write preamplifier which amplifies data signals from a disk during reading. This differential input signal is applied to the differential input leads of gain controlled amplifier 104, whose gain is set by automatic gain control circuit 110. The differential output signal from gain controlled amplifier 104 is applied to differential filter 106, whose differential output signal is applied to gate channel input 107 and time channel input 108.

Differential filter 106 serves to remove noise that lies outside the bandwidth of the read channel signal, thereby preventing noise in the desired signal from being applied to gate channel input 107 and time channel input 108.

A by-product of filter 106 is the amount of group delay it introduces between the output of amplifier 104 and the gate and time channel inputs 107 and 108, which will hereafter be generally referred to as the "channel input."

FIG. 2 shows various waveforms depicting the operation of pulse detector 100 of FIG. 1 operating on a typical hard disk read channel signal. FIG. 2 illustrates how noise in shoulder region 201 (the flat region near base line 202 occurring between peaks 203) is removed from encoded data output signal 207. The process of removing noise is called signal qualification. Signal qualification is accomplished with circuitry devoted to this task. Signal qualification refers to a particular point in time when a decision is made as to whether or not a disk signal is to be considered valid. A valid signal will at some point produce an output signal from pulse detector 100 (FIG. 1). Signal qualification is accomplished by pulse detector 100 by allowing the signal applied to the D input lead of flip-flop 101 to change when the signal applied to differential input lead 105 crosses a predefined hysteresis level (shown as dashed lines 303 in FIGS. 2 and 3). In this way noise 208 occurring in time pulse output signal 204, which serves as the clock signal applied to flip-flop 101 (FIG. 1), only clocks in old data to flip-flop 101. In other words, only time pulse output signal 209 corresponding to peak 203 of the disk waveform is allowed to propagate to encoded data output terminal 103, since noise 208 clocks in the same data as does dara pulse 209 corresponding to peak 203.

For the most part, this type of circuit does a good job of removing baseline noise which occurs in shoulder region 201 of the disk read signal waveform. However, base line noise is not the only type of noise present in a read signal from a disk. FIG. 3 shows a disk signal that contains "off track noise": noise that results from the read head picking up some of the signals on adjacent tracks. The interfering tracks cause false peaks 302 that can occur above hysteresis threshold level 303. False peaks 302 can result in errors because they are not masked by prior art detection circuitry. Thus, with prior art circuits, an encoded data output signal is produced corresponding to false peaks 302 and not the real peak 301.

Another potential problem with prior art detection circuitry is the critical timing relationship between the clock signal (i.e. the timing channel) and the D input signal to flip-flop 101 (i.e. the gating channel). If there is a timing skew such that time pulse output signal 204 (FIG. 2) is delayed in relation to the output signal from comparator with hysteresis 205, then it is possible, for noise in shoulder region 201 to generate errors on encoded data output signal 207 available on output lead 103. FIG. 4 illustrates how this can happen. FIG. 4 shows a noise spike PA occurring below hysteresis threshold 303 and prior to the true disk signal peak PB. Differentiator 111 responds to all signal peaks including noise spike PA and produces an output signal that is applied to the clock input lead of flip-flop 101. The output signal from differentiator 111, however, is delayed by any delay in the logic in the path between the output of differentiator 111 and the clock input lead of flip-flop 101 and RC network 114, 115 (typically formed as external components). This delay is indicated as Td in FIG. 4.

The signal applied to the D input lead of flip-flop 101 serves as the qualification signal. For the circuit of FIG. 1, qualification occurs when the disk read signal crosses the appropriate hysteresis threshold level. Because of delay Td, the clock signal due to PA occurs after the signal applied to the D input lead of flip-flop 101 changes state. Consequently, the clock signal due to noise spike PA clocks in the new data to flip-flop 101. The true peak at PB clocks in old data and the state of flip-flop 101 does not change. Consequently, pulse detector 100 provides an incorrect pulse PI at the data output lead, corresponding to noise spike PA and not true peak PB, even though noise spike PA was below the qualification level set by hysteresis threshcld level 303. In this event, the correct pulse PC corresponding to peak PB is not provided.

SUMMARY

The self-timing qualification channel circuitry of this invention offers improvements to both the above problems with the prior art. A timing comparator is used in addition to the hysteresis comparator, in order to detect when the true peak is about to occur. The timing comparator output determines when signal qualification by the hysteresis comparator is to occur. The timing comparator only allows signal qualification to occur just prior to the true peak in the disk read input signal. Because of this, the risk of falsely detecting off track noise or noise in the shoulder region is greatly reduced.

BRIEF DESCRIPTION OF THE DRAWINGS

FIG. 7a is a schematic diagram of one example of a filter suitable for use as filter 506 of FIG. 5;

FIG. 7b is a graph depicting the amplitude response with respect to frequency for the filter of FIG. 7a;

FIG. 11 is a set of waveforms depicting the operation of the embodiment of FIG. 10.

DETAILED DESCRIPTION

Figure 5:
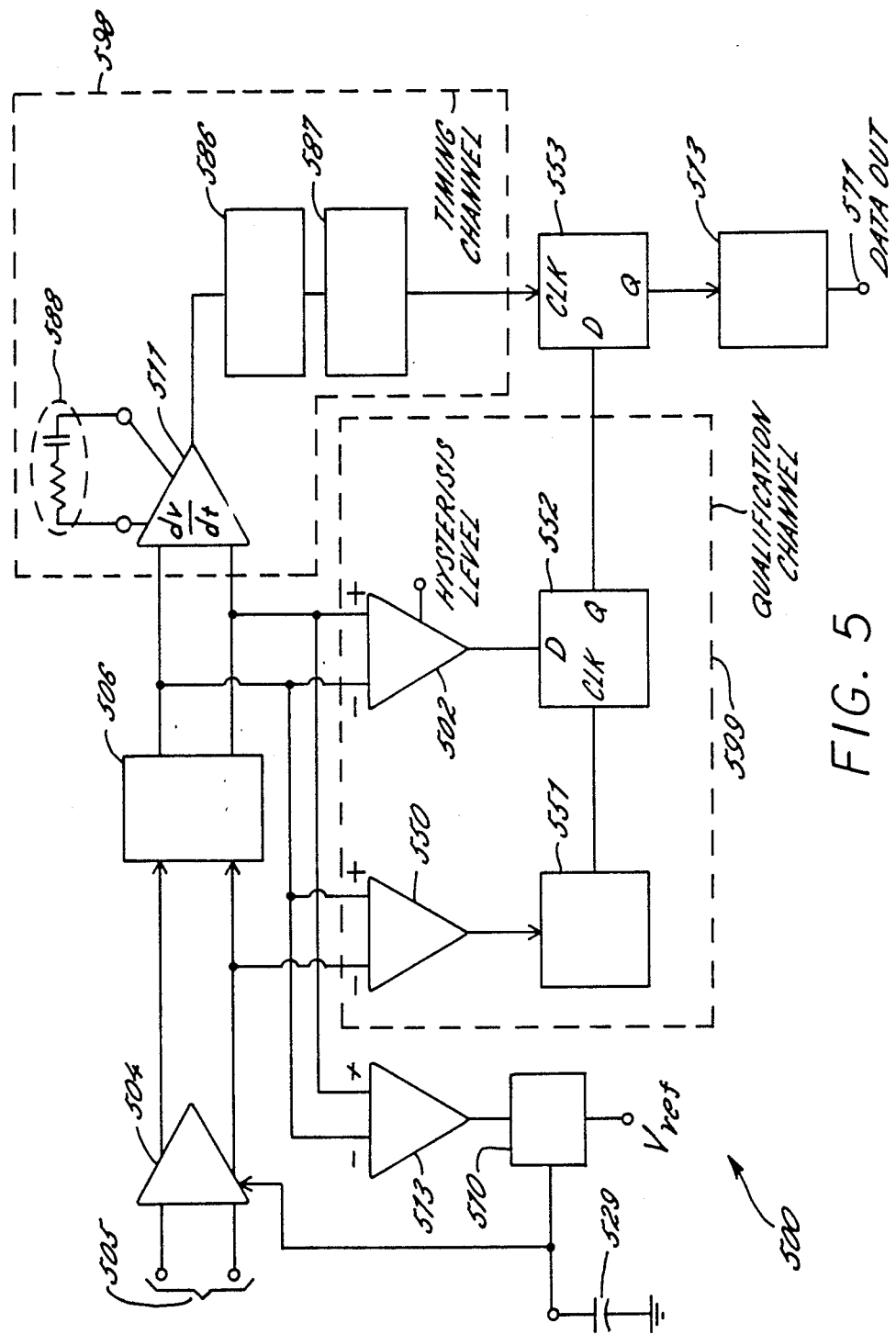
FIG. 5 is a schematic diagram of one embodiment of a pulse detector constructed in accordance with the teachings of this invention.

One embodiment of a circuit constructed in accordance with the teaching of this invention is shown in FIG. 5. Circuit 500 includes differential input leads 505 for receiving a differential read signal from a disk (or the read/wire preamplifier of a disk). This differential input signal is applied to the differential input leads of gain controlled amplifier 504, whose differential output signal is applied to differential filter 506, which in turn applies its differential output signal to differentiator 511. The output of differentiator 511 feeds zero cross detector 586, which produces an output transition whenever the input signal to differentiator 511 passes through a peak. The output of zero cross detector 586 feeds bi-directional one-shot 587, which produces a positive going pulse when the input signal to bi-directional one-shot 587 changes state. Thus, bi-directional one-shot 587 produces an output pulse whenever the output signal of zero cross detector 586 makes a transition which, as previously stated, occurs whenever the input signal to differentiator 511 passes through a peak. The output of bi-directional one-shot 587 is referred to as the "time channel output signal" or the "time pulse signal."

The time pulse signal is the clock for flip-flop 553. This flip-flop combines the time channel signal and the qualification signal (discussed below). If the D input to this flip-flop has changed (i.e., signal qualification has occurred) then the time pulse signal will clock in this change, producing a state change at the flip-flops Q output. The timing of this state change therefore depends on the time pulse signal which ultimately depends on the peak of the input signal to the differentiator. The Q output of flip-flop 553 feeds a bi-directional one-shot which produces as an output, a pulse whenever the Q output changes state. This pulse is the output of the pulse detector.

Figure 6:
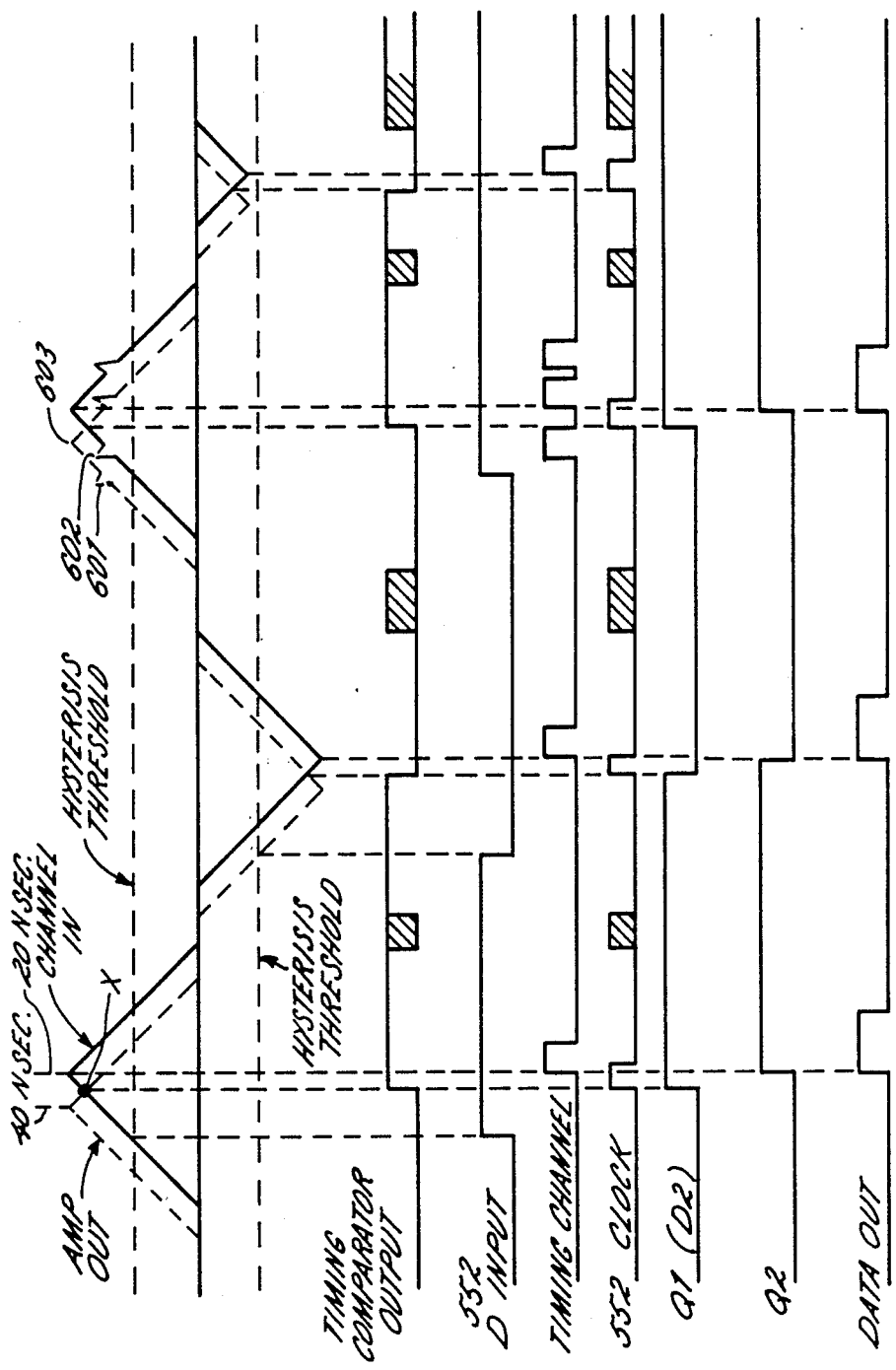
FIG. 6 is a set of waveforms depicting the operation of the circuit of FIG. 5.

Hysteresis comparator 502, timing comparator 550, one-shot 551 and flip-flop 552 form qualification channel 599. Hysteresis comparator 502 receives the differential output signal from differential filter 506 and provides an output signal to the D input lead of D flip-flop 552. Timing comparator 550 detects the true peak of the input signal by comparing the output signal of amplifier 504 with the input signal of qualification channel 599 (i.e. the signal from filter 506). These two signals are essentially the same, with the input signal to qualification channel 599 delayed in time with respect to the output signal from amplifier 504 due to filter 506. Because of this delay, the output signal from amplifier 504 passes through its peak and starts towards the base line prior to this occurring in the input signal to qualification channel 599. Consequently, there is a crosspoint "x" (FIG. 6) where the level of the output signal from amplifier 504 crosses the level of the input signal to qualification channel 599. Crosspoint "x" always occurs just prior to the true peak in the channel signal as long as the input signal to qualification channel 599 and the output signal from amplifier 504 are of the same amplitude.

Referring again to the embodiment of this invention depicted in the schematic diagram of FIG. 5, the output signal from timing comparator 550 is applied to the input lead of bi-directional one shot 551. The output signal from bi-directional one shot 551 serves as a clock signal applied to D flip-flop 552. Since the D input lead of D flip-flop 552 is connected to receive the output signal from hysteresis comparator 502, D flip-flop 552 will only change its state at crosspoint "x" corresponding to a time just prior to the channel signal reaching its peak.

Figure 4:
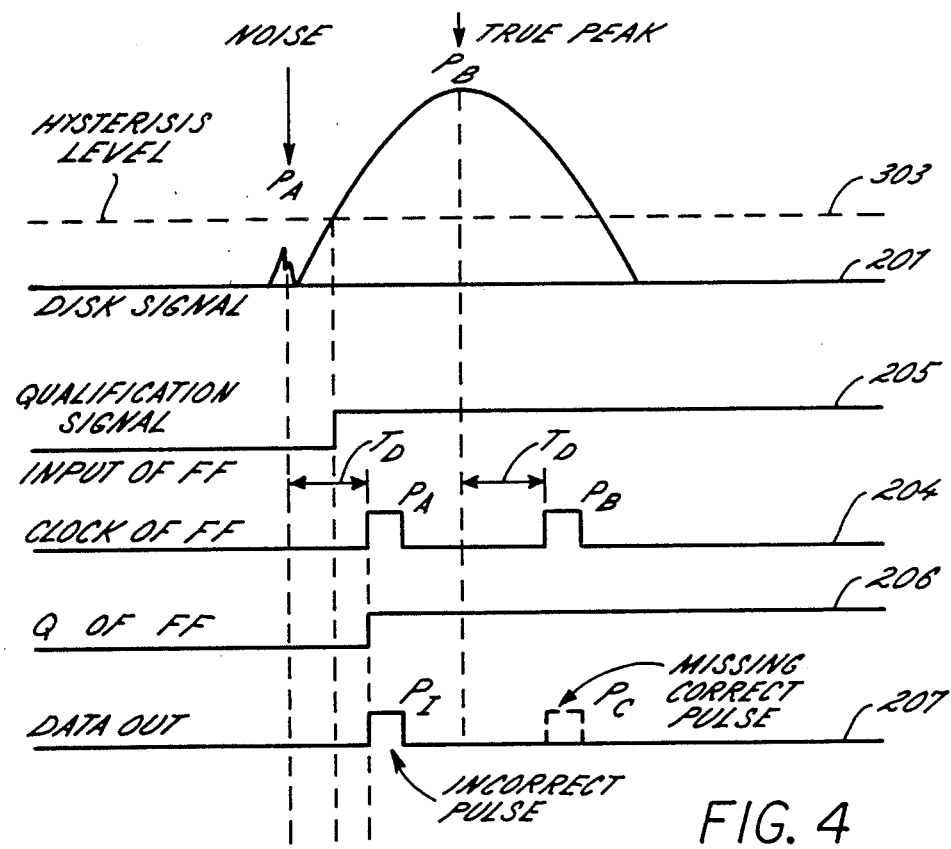
FIG. 4 is a timing diagram depicting the critical timing relationship between the clock signal and the D input signal of the prior art circuit of FIG. 1.

Noise or false peaks that do not produce a crosspoint "x" will not produce a change at the D input lead of flip-flop 553 and consequently will not produce an output signal. In particular, noise pulses 601 and 602 near peak 603 do not produce cross points, due to their magnitude. Noise or false peaks that occur prior to the change of state of the D input signal of flip-flop 553 will only generate timing channel pulses that clock in old data into flip-flop 553. Consequently, the timing channel signal that the false peak generates will only clock in old data to flip-flop 553 and not produce a data output pulse. By a similar token, the effect of excess delay in the time channel is minimized because of the greatly delayed signal qualification. Thus, the circumstance illustrated in FIG. 4 is prevented from occurring in accordance with the teachings of this invention.

One may wonder if a fixed delay between the gating and timing channels would not accomplish the same thing. For a given frequency and amplitude, the answer is yes. However, a disk signal varies in both frequency and amplitude. A fixed delay would not be able to work consistently.

Clearly, this system will only work if the amount of off track noise is sufficiently small as to not produce a cross point. Nonetheless, it only takes a small amount of delay between amplifier output and the channel input to produce a significant amount of noise immunity.

Figure 7:
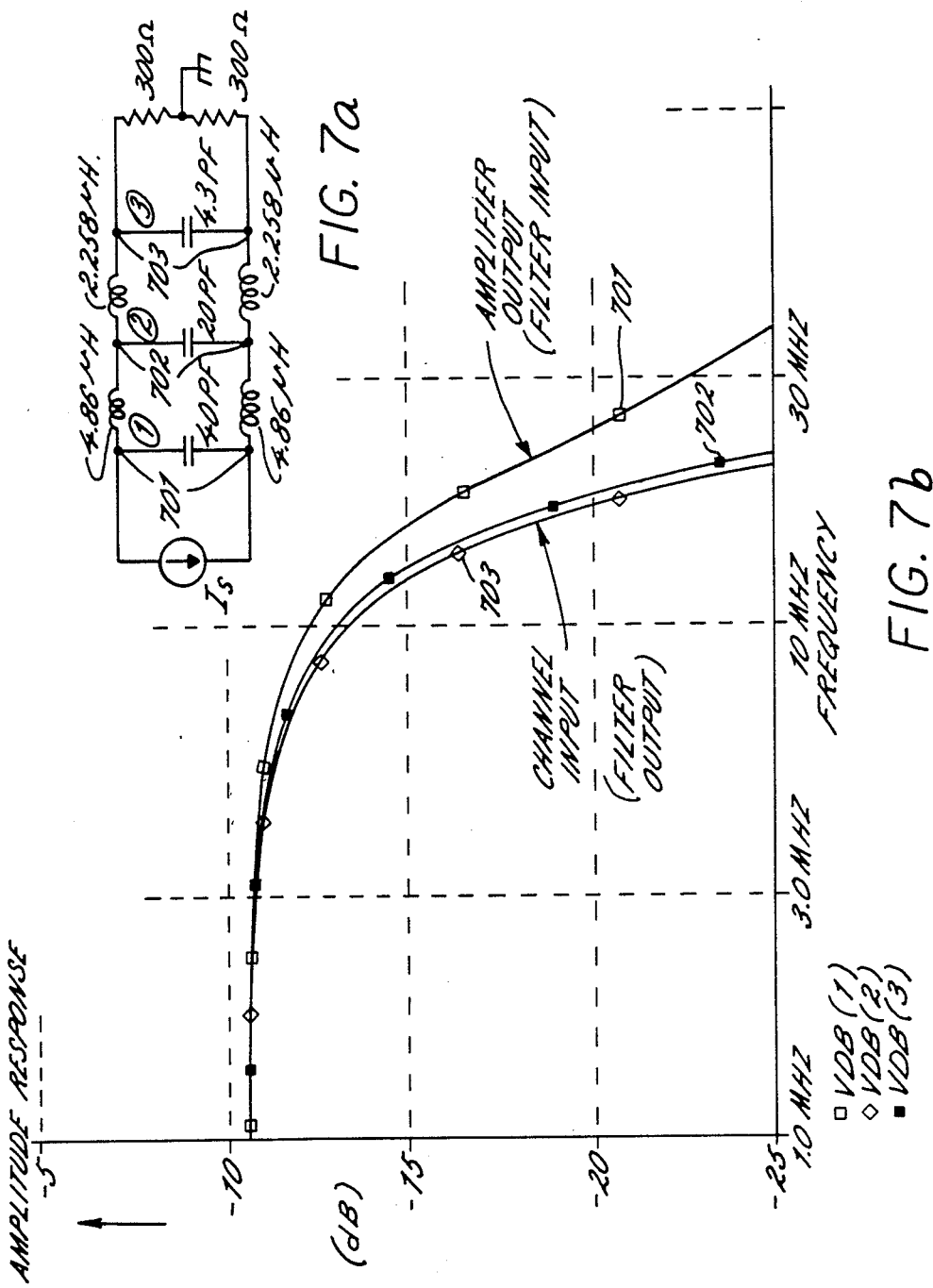
Figure 8:
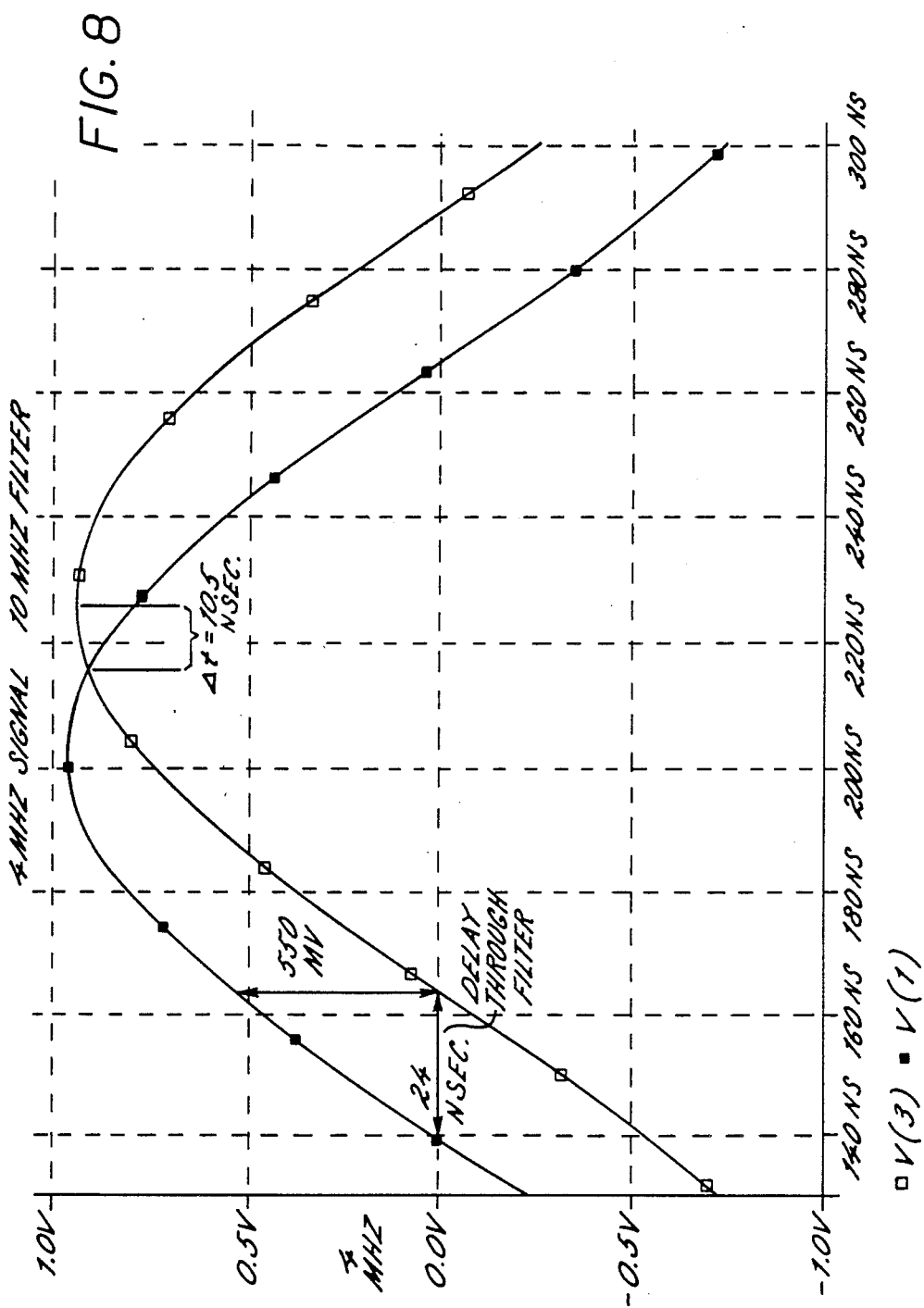
FIG. 8 is a graph depicting the noise improvement achieved utilizing one embodiment of this invention.

FIG. 8 gives an indication of the amount of noise improvement to be expected from the self timing qualification channel technique. This figure shows the plot of a 4 MHz sinusoidal signal at the input and the output of the filter shown in FIG. 7a. This signal experiences 24 nS of delay through the filter and produces a crosspoint 10.5 nS prior to the true peak of the signal. A noise tolerance of 550 mv is produced for the 1 V peak signal shown. This represents 55% of the signal amplitude. As is readily understood in light of the teachings of this invention, the amount of noise tolerance will depend on the frequency, wave shape of the signal, channel filter bandwidth, and relative amplitude of the signal at the input vs. the output of the filter.

Figure 1:
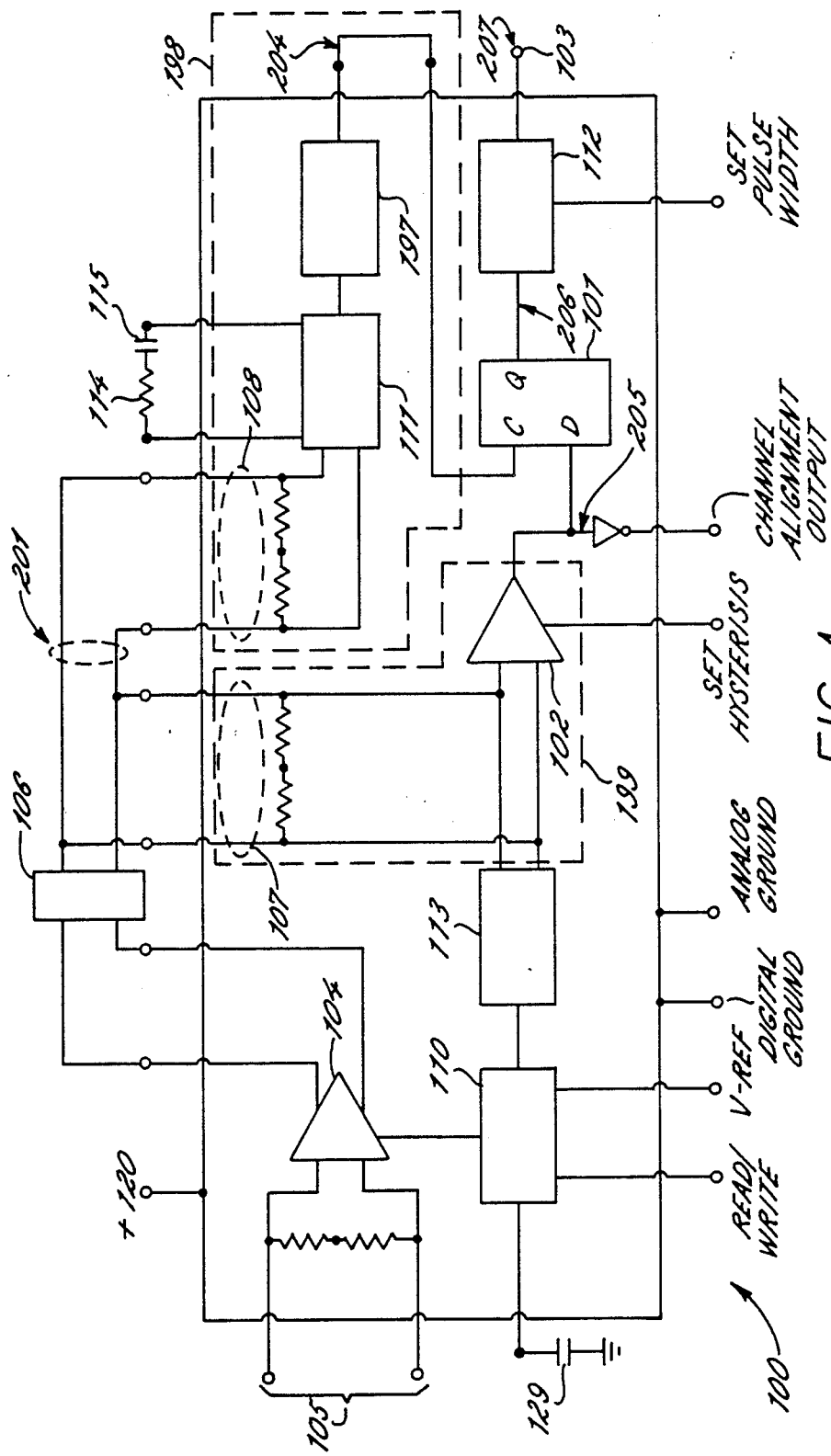
FIG. 1 is a schematic diagram of a typical prior art pulse detector, in this case the National Semiconductor DP8464B device.
Figure 2:
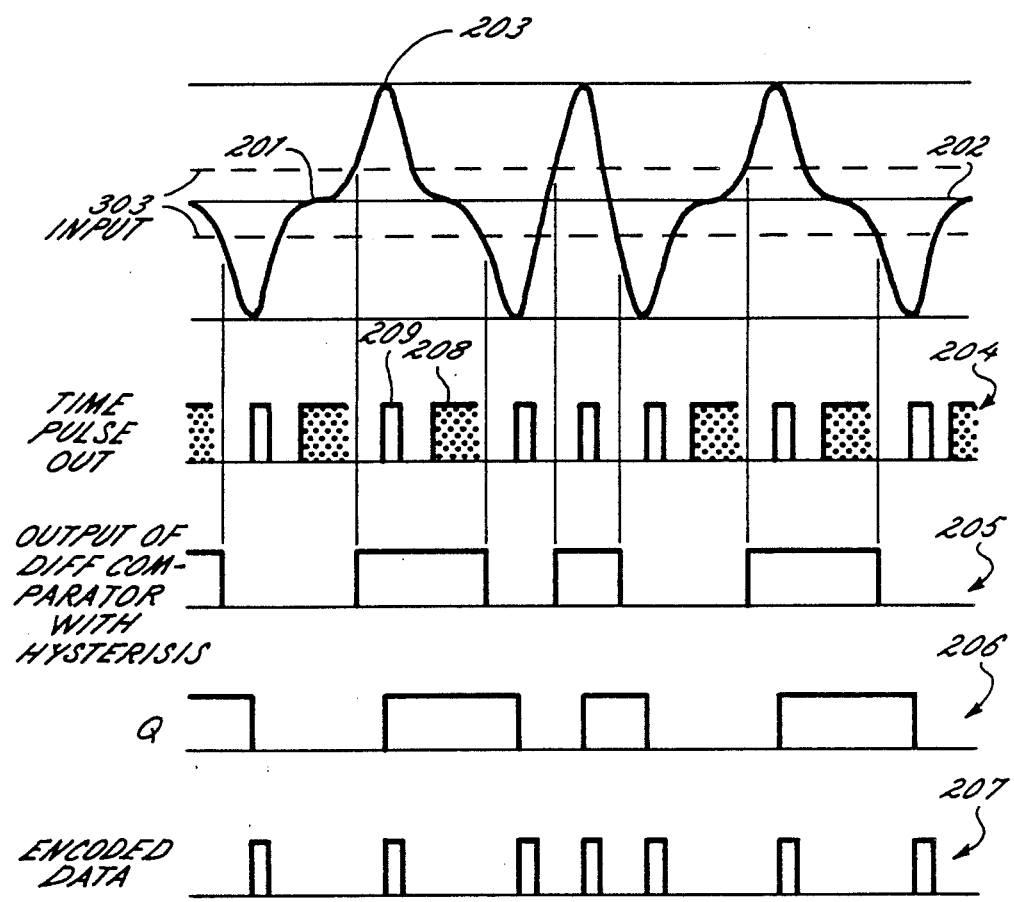
FIG. 2 is a set of waveforms associated with the operation of the circuit of FIG. 1.
Figure 3:
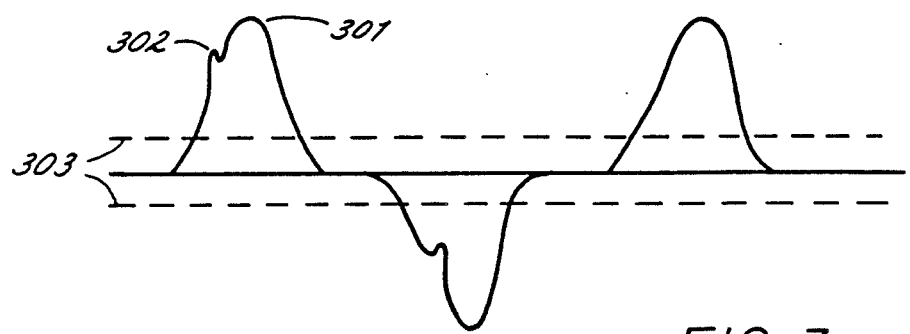
FIG. 3 is a waveform depicting hysteresis levels and off track noise associated with a read signal from a disk drive.

As previously mentioned, the teachings of this invention offer a significant improvement in the rejection of noise appearing in the shoulder region between pulses. As previously discussed, FIG. 4 illustrates the timing errors that this noise can cause with regard to a pulse detector of the type shown in FIG. 1. Had qualification signal 205 in FIG. 4 been delayed so that it changed state just prior to true peak PB of the input signal, noise pulse PA would not have been allowed to clock in new data into the flip flop (in FIG. 4 PA would have clocked in a LOW) and the incorrect pulse PI would not have been generated. Instead the correct pulse PC would have been generated.

In accordance with the teachings of this invention, qualification signal 205 is delayed from changing state until just prior to true peak PB of the input signal. As previously discussed, qualification is only allowed to occur at a cross point, which occurs just prior to true peak PB. By so delaying the channel qualification, noise pulse PA will clock in old data into the flip-flop, the output of the flip flop will not change state and thus a data output pulse is not produced in response to noise pulse PA. The circumstance illustrated in FIG. 4 is avoided.

One solution to the problem illustrated in FIG. 4 is to increase the hysteresis level. Increasing the hysteresis level also causes qualification signal 205 to be more delayed. Unfortunately, there are other constraints on the hysteresis noise problem. Some of these constraints deal with tolerance to disk defects, and worse case patterns. Consequently, increasing the hysteresis level to solve the noise problem may not be practical. In accordance with the teachings of this invention, a viable solution is provided without the constraints that increasing the hysteresis level impose.

Another solution to the shoulder noise problem is to add a fixed delay in the qualification channel. Unfortunately, the amount of required delay depends on the data rate, pulse shape, and external differentiator components. As a result, such a delay must be made programmable, and circuitry employed to select an appropriate delay. The advantage of the teachings of this invention is that the correct qualification timing are established independent of data rate and external components.

Preferably, the signal from output amplifier 504 (FIG. 5) is well filtered by filter 506. In one embodiment, filter 506 is constructed external to the integrated circuit containing remaining components of the embodiment of FIG. 5. In one embodiment, filter 506 is current driven rather than voltage driven, so that the filter input impedance characteristics are such as to provide a large amount of filtering of the drive signal. Another desirable consequence of the current driven filter is that there is little loss through the filter within the bandwidth of the filter. Providing a well filtered filter input signal of equal amplitude to the signal at the filter output results in accurate signal comparisons through the timing comparator 550.

One example of a 5 pole 10 MHz Bessel filter suitable for use as filter 506 of FIG. 5 is shown in FIG. 7a, together with component values FIG. 7b plots the amplitude characteristics for the filter of FIG. 7a nodes 701 (corresponding to the input of filter 506), 702, and 703 (corresponding to the output of filter 506). Of importance, the roll off characteristic of the input nodes is nearly the same as that of the output nodes. Also, since the filter is current driven, there is little loss through the filter within the filter pass band.

Because the dc output level of gain controlled amplifier 504 (FIG. 5) is likely to be different from the dc level at the input to qualification channel 599, timing comparator 550 is preferably AC coupled. In one embodiment, the components of the embodiment of FIG. 5 other than filter 506, differentiator components 588, and capacitor 529 are constructed in a single integrated circuit. Two fairly large (typically 5 pf) low leakage capacitors are connected in series with the differential input leads of timing comparator 550 and timing comparator 550 is constructed to have a high input impedance. It has been determined that the AC coupling capacitors connected to the differential input leads of timing comparator 550 can be of a size which does not take up an inordinate amount of surface area of an integrated circuit without adversely affecting the bandwidth of timing comparator 550. In one embodiment, the zeros created by these AC coupling capacitors are such that timing comparator 550 will only effectively receive input signals greater than about 1 MHz. This has been found to be quite acceptable, as most disk drives provide output read signals well above 1 MHz.

Figure 9:
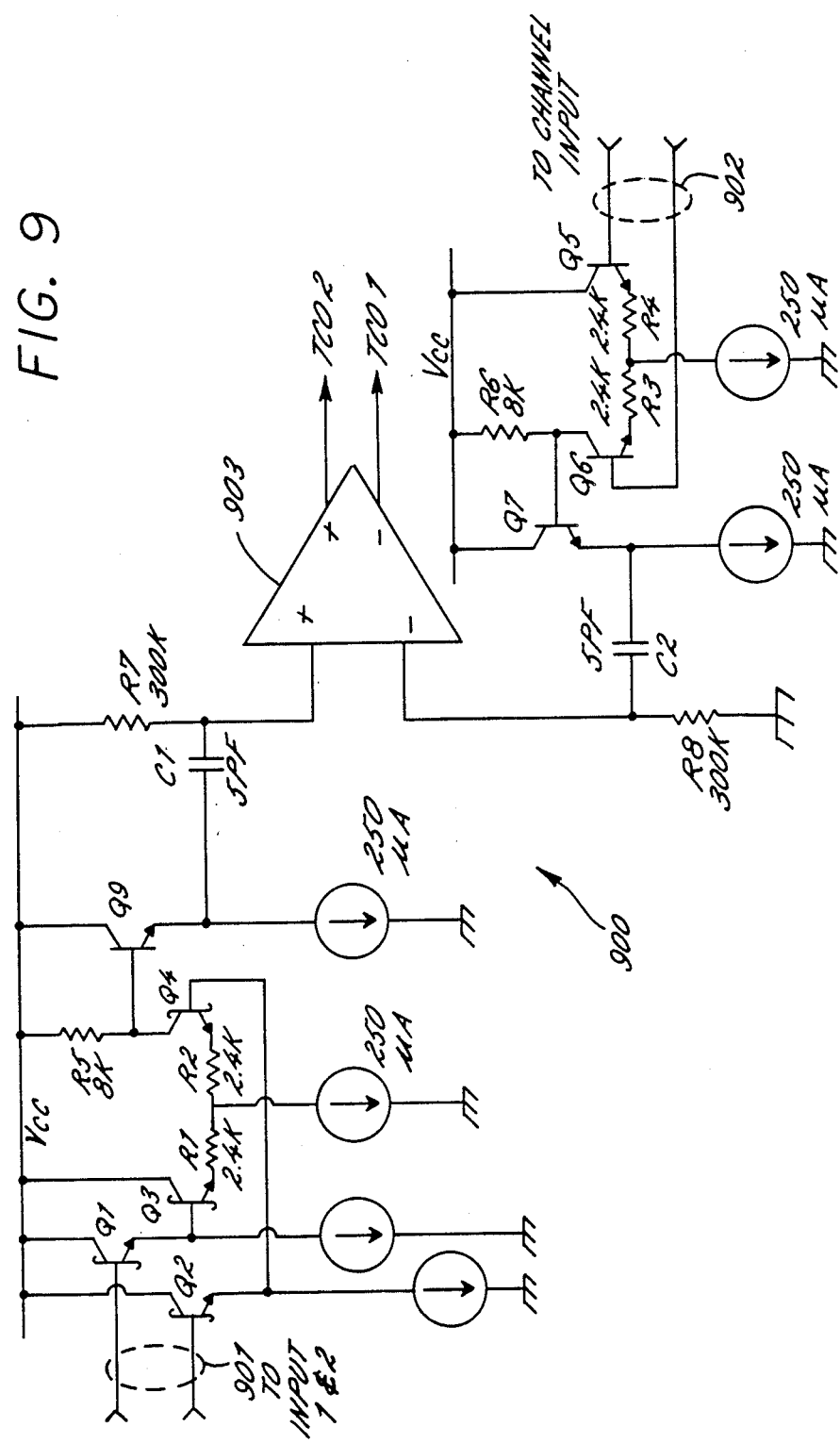
FIG. 9 is a schematic diagram of one embodiment of a timing comparator suitable for use in accordance with the teachings of this invention.

FIG. 9 shows in more detail one embodiment of timing comparator 550 of FIG. 5. In this embodiment, the connection 901 to the output of gain controlled amplifier 504 and connection 902 to the input of qualification channel 599, are fully differential as opposed to the single ended connection shown in the embodiment of FIG. 5. The differential connection allows for common mode rejection of noise that might cause a false output signal from timing comparator 550. The RC networks formed by components $R_7$, $C_1$, and $R_8$, $C_2$ determine the minimum frequency of operation of timing comparator 900. Resistors R1 and R2 provide enough degeneration for the amplifier formed by transistors Q3 and Q4 to allow low distortion amplification of the amplifier output signal, even if there is significant amplifier output offset. Resistors R1, R2, R5 and R3, R4, R6 also set the relative gain of the channel input signal to the amplifier output signal. In FIG. 9, the ratio of (R5/R2)/(R6/R3)=(8K/2.4K)/8K/2.4K)=1. Consequently, the resistor selection of timing comparator of FIG. 9 is designed for equal amplifier output and channel input signal amplitudes. Alternatively, resistor values are selected such that, for example, the above ratio is equal to .5, in which case the timing comparator is properly designed for a channel input signal equal to half the amplifier output signal. In this manner, the timing comparator of FIG. 9 can be tailored to account for losses in the channel filter. Capacitors C1 and C2 remove the effects input offsets might have on the timing comparison made by comparator 903. In one embodiment, the input devices of comparator 903 are MOS devices in order to eliminate voltage drops across resistors R7 and R8 which might cause offsets and, consequently timing errors.

Figure 10:
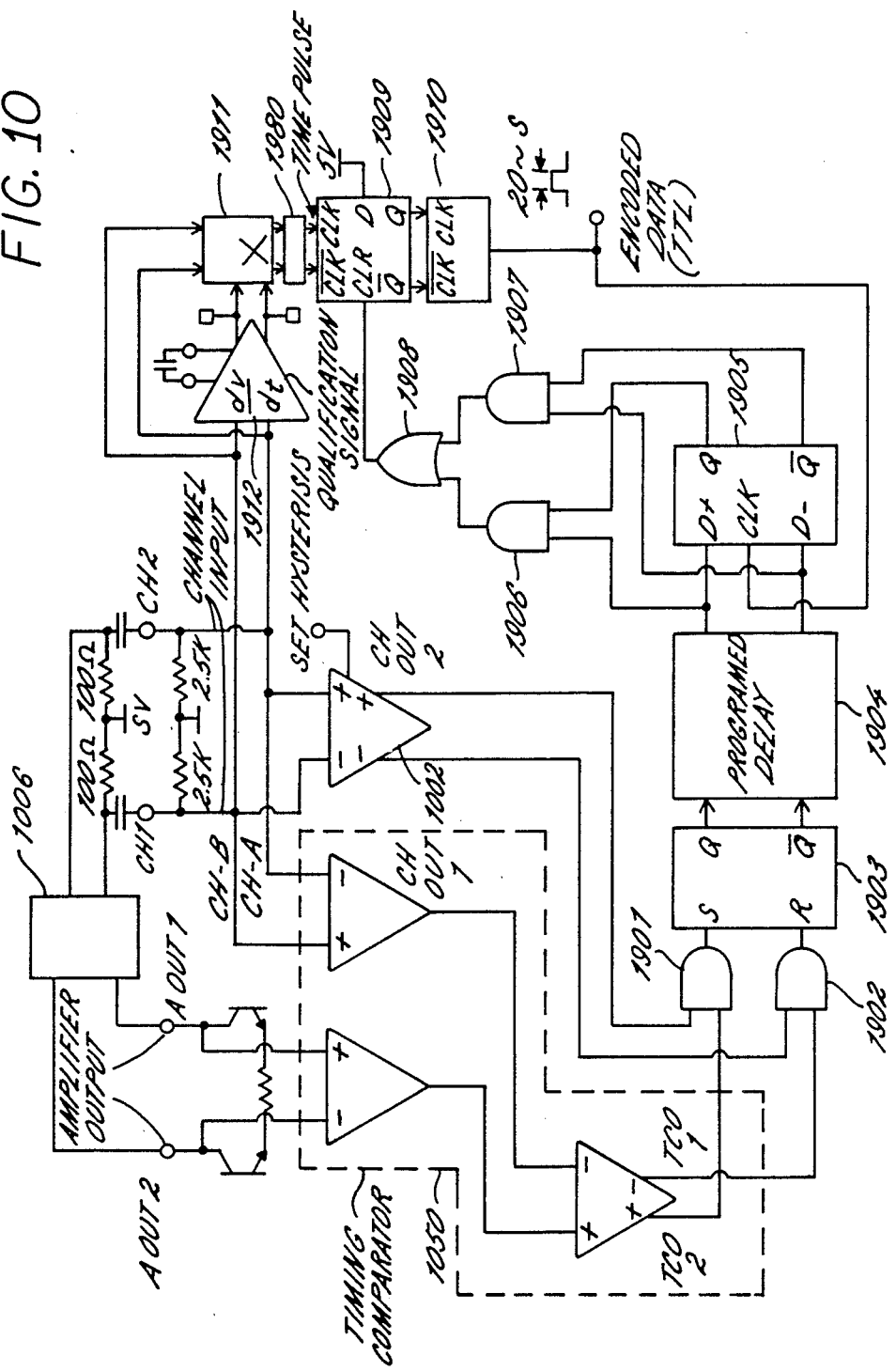
FIG. 10 is a schematic diagram of one embodiment of a qualification channel suitable for use in accordance with the teachings of this invention.

FIG. 11 is a timing diagram that illustrates the operation of the circuit of FIG. 10. In FIG. 11, the topmost signal is the analog disk waveform at the outputs $A_{out1}$ and $A_{out2}$ of gain controlled 504 (FIG. 5) amplifier and filter 1006. The dashed lines show the hysteresis threshold levels. The hysteresis comparator output signal changes state when the channel signal crosses the appropriate hysteresis threshold level. This signal is AND'ed with the output of timing comparator 1050 by AND gates 1901 and 1902. Flip-flop 1903 removes noise that might be present in the output signal of timing comparator 1050, by latching the signals from AND gates 1901 and 1902. The output signal of flip-flop 1903 passes through delay line 1904 to the D input leads of flip-flop 1905. Delay line 1904 is programmed for zero delay for purposes of this discussion, and is omitted in an alternative embodiment. The Qualification Signal from the output lead of OR gate 1908 goes low when the signal applied to the D input leads of flip-flop 1905 are of opposite polarity as the Q output signal of flip-flop 1905. When the Qualification Signal goes low, the clear signal applied to flip-flop 1909 is removed. Flip-flop 1909 is clocked high by the Time Pulse signal output from zero cross detector 1980. This produces a 20 nS Encoded Data pulse output from output One shot 1910. This output pulse also clocks flip-flop 1905 causing the Qualification Signal to go high again and reassert the clear to flip-flop 1909.

FIG. 10 also shows multiplier 1911 connected to the output of differentiator 1912. Multiplied 1911 multiplies the output signal of differentiator 1912 by the input signal to differentiator 1912. This produces an output signal from multiplier 1911 that transitions through zero in the same direction for either positive or negative peaks of the differentiator input signal. Use of multiplier 1911 eliminates the need for a bi-directional one-shot, such as one-shot 587 in FIG. 5. The output signal of multiplier 1911 feeds zero cross detector 1980, which produces a logic transition whenever the output signal of multiplier 1911 passes through zero. The output signal of zero cross detector 1980 is referred to as the "time channel" Or "time pulse" output signal.

One problem that can occur in the circuit of FIG. 5 is that no qualification signal will be generated if the cross point occurs below the hysteresis threshold. In this circumstance the cross point clocks in old data to the hysteresis flip-flop, 552, which does not allow the flip-flop to change state. If hysteresis flip-flop 552 does not change state, then no qualification signal is generated and thus output flip-flop 553 does not change state. Consequently, no output pulse is generated even though the channel signal crossed the hysteresis threshold. This is not ideal operation. Ideally, whenever channel signal crosses the proper hysteresis threshold, a pulse detector output should occur.

The embodiment of FIG. 10 operates such that even if the cross point occurs below the hysteresis threshold, a qualification signal and resulting output pulse will occur. The embodiment of FIG. 10 is shown to operate with a timing comparator that accepts fully differential input signals from the output of gain controlled amplifier 504 and the input of qualification channel 599. As previously mentioned, this has the advantage of providing common mode rejection of timing comparator input noise that might have otherwise caused inaccurate timing comparator output signals.

It is interesting to note that timing comparator 1050 (or 550) is actually performing the function of what is called a "delay line differentiator". In other words, the output of timing comparator 1050 is the derivative of the input to timing comparator 1050. The difference between the delay line differentiator and the normal pulse detector differentiator (511 in FIG. 5; 1912 in FIG. 10) is that the delay line differentiator produces an output signal just prior to the peak of the input signal, whereas the normal differentiator produces an output signal just after the peak of the input signal. It is this preknowledge of the peak of the input signal that is used to advantage in the self-timing qualification channel of this embodiment.

Thus, in accordance with the teachings of this invention, and its various embodiments, with the addition of a single timing comparator and a little more logic, a greatly improved qualification channel has been achieved as compared with the prior art. The timing comparator operates without the need for additional external components by utilizing the existing channel filter. Thus, the channel filter serves two purposes: to filter the channel input signal prior to detection and to provide delay for the timing comparator. The detector of this invention is ideally suited to detecting data from a constant density recording environment where a multiple data rates are encountered. The improved immunity to off track noise allows track density to be increased, thereby increasing the storage capacity of the disk.

That the output of timing comparator 1050 is actually the derivative of the input lends itself to the possibility that differentiator 1912 can be entirely eliminated from the pulse detection process.

In an alternative embodiment, similar to that of the embodiment of FIG. 5, timing comparator 550 is formed as a delay line differentiator, the output signal from flip-flip 552 is applied directly to the input lead of bidirectional one-shot 513, and flip-flop 553, differentiator 511, zero cross detector 586, and on-shot 587 are eliminated in their entirety. The output signal from bidirectional one-shot 513, through the action of delay line differentiator serving as timing comparator 550, is valid, fully qualified, pulse detector output data.

In an alternative embodiment, related to the embodiment of FIG. 10, the output leads of flip-flop 1903 are connected directly to a bidirectional one-shot, and programmable delay means 1904, flip-flop 1905, AND gates 1906 and 1907, OR gate 1908, flip-flop 1909, one-shot 1910, differentiator 1912, multiplier 1911, and zero cross detector 1980 are all eliminated.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A pulse detector comprising:
   an input port for receiving an input signal;
   an output port for providing an output signal in response to a pulse of a desired amplitude in said input signal;
   a filter having an input port for receiving said input signal and an output port for providing a filtered signal; and a qualification channel for providing a qualification channel output signal when a pulse contained in said input signal is likely to be a valid data pulse, said qualification channel comprising:
 a timing comparator having a first input port for receiving said input signal, a second input port for receiving said filtered signal, and an output port for providing a timing comparison signal indicative of when the magnitudes of said input signal and said filtered signal have a predefined relationship; and
 level detection means for providing a level detection output signal when said filtered signal has reached a predefined level, said level detection means being enabled by said timing comparison signal.

2. A pulse detector as in claim 1 wherein said timing channel comprises a differentiator having an input port for receiving said filtered signal and an output port for providing a differentiated signal for generating said timing channel output signal.

3. A pulse detector as in claim 1 which further comprises:
 a timing channel for providing a timing channel output signal indicative of the time position of peaks contained in said input signal at any given time; and
 means for providing an output signal indicative of said peaks contained in said input signal as defined by said timing channel output signal, at a time determined by said timing channel output signal as enabled by said qualification channel output signal.

4. A pulse detector as in claim 3 wherein said means for providing an output signal further comprises output latch means having an input lead for receiving said qualification channel output signal, a clock input lead for receiving said timing channel output signal, and an output lead for providing a latched output signal.

5. A pulse detector as in claim 4 which further comprises:
 a pulse generator means having an input lead connected to said output lead of said output latch means, and an output lead for providing an output pulse in response to said latched output signal.

6. A pulse detector as in claim 3 which further comprises means for clearing said means for providing an output signal, said means for clearing operating in response to said output signal.

7. A pulse detector as in claim 1 wherein said level detection means comprises a hysteresis comparator having an input port connected to said output port of said filter, a hysteresis input lead for receiving a hysteresis level control signal, and an output port.

8. A pulse detector as in claim 1 wherein said timing comparator serves to improve immunity to noise contained in portions of said input signal between data pulses.

9. A pulse detector as in claim 8 wherein said timing comparator serves to improve immunity to noise contained in portions of said input signal above said predefined level.

10. A pulse detector as in claim 8 wherein said timing comparator serves to improve immunity to noise contained in portions of said input signal between data pulses and below said predefined level.

11. A pulse detector as in claim 1 wherein said filter serves to provide a delay between said input signal and said filtered signal.

12. A pulse detector as in claim 1 wherein said timing comparator is AC coupled to said input and output ports of said filter.

13. A pulse detector as in claim 1 wherein said qualification channel further comprises:
 pulse generation means having an input lead connected to said output lead of said timing comparator, and having an output lead; and
 a latch having an input lead connected to said output lead of said level detection means, a clock input lead connected to said output lead of said pulse generation means, and an output lead for providing said qualification channel output signal.

14. A pulse detector as in claim 1 wherein said timing comparator serves as a delay line differentiator.

15. A pulse detector as in claim 14 wherein said pulse detector further comprises:
 means for logically combining said output signal of said timing comparator and said output signal of said level detection means to produce a control signal; and
 first latch means having an input port for receiving said control signal, and having an output port.

16. A pulse detector as in claim 15 wherein said pulse detector further comprises:
 second latch means having an input port connected to said output port of said delay means, and having an output port; and
 means for logically combining the output signals from said first latch means and said second latch means to provide said qualification signal.

17. A pulse detector as in claim 16 which further comprises delay means for delaying the output signal of said first latch means.

18. A pulse detector as in claim 16 wherein said second latch means further comprises a clock input lead connected to said output lead of said pulse detector.

19. A pulse detector as in claim 14 which further comprises:
 a latch having an input led connected to said output lead of said level detection means, a clock input lead connected to said output lead of said timing comparator, and an output lead; and
 a pulse generator having an input lead connected to said output lead of said latch, and an output lead serving as said output lead of said pulse detector.

20. A pulse detector as in claim 1 wherein said timing comparator comprises:
 a first differential amplifier having differential input leads connected to said input port of said differential filter, and having an output lead;
 a second differential amplifier having differential input leads connected to said output port of said differential filter, and having an output lead;
 a comparator having a first input lead connected to said output lead of said first differential amplifier, a second input lead connected to said output lead of said second differential amplifier, and an output lead serving as said output lead of said timing comparator.

21. A pulse detector as in claim 20 wherein the gains of said first and second differential amplifiers are such that said timing comparator produces an output signal prior to said filtered output signal reaching its peak.

22. A method for the detection of valid data pulses in an input signal comprising the steps of:
 receiving said input signal;

filtering said input signal to produce a filtered and delayed signal;

comparing said input signal and said filtered and delayed signal to determine a point in time when said filtered and delayed signal is about to reach a peak;

detecting a peak in said filtered and delayed signal during a time period after said point in time.

23. A method as in claim 22 wherein said step of detecting a peak comprises the steps of:

detecting a plurality of peaks in said filtered and delayed signal; and selecting one of said plurality of peaks as a valid data pulse at or near said point in time determined by said step of comparing.

24. A method as in claim 23 wherein said step of comparing comprises the steps of:
 (a) detecting when said filtered and delayed signal has a magnitude greater than a predefined magnitude;
 (b) detecting the point in time when said input signal and said filtered and delayed signal have a predefined relationship;
 (c) generating a qualification signal in response to steps (a) and (b); and
 (d) using said qualification signal to perform said step of selecting.

* * * * *